(12) United States Patent
Zhao et al.

(10) Patent No.: US 6,712,983 B2
(45) Date of Patent: Mar. 30, 2004

(54) METHOD OF ETCHING A DEEP TRENCH IN A SUBSTRATE AND METHOD OF FABRICATING ON-CHIP DEVICES AND MICRO-MACHINED STRUCTURES USING THE SAME

(75) Inventors: Yang Zhao, North Andover, MA (US); Yaping Hua, Wuxi (CN)

(73) Assignee: Memsic, Inc., Andover, MA (US)

( * ) Notice: Subject to any disclaimer, the term of this patent is extended or adjusted under 35 U.S.C. 154(b) by 483 days.

(21) Appl. No.: 09/833,973

(22) Filed: Apr. 12, 2001

(65) Prior Publication Data

US 2002/0148807 A1 Oct. 17, 2002

(51) Int. Cl.[7] .................................................. B81C 1/00
(52) U.S. Cl. ................. 216/2; 216/24; 216/49; 216/51; 216/67; 216/72; 216/79; 438/701; 438/710; 438/713; 438/714
(58) Field of Search ................. 216/2, 24, 49, 216/51, 67, 72, 79; 438/701, 710, 713, 714

(56) References Cited

U.S. PATENT DOCUMENTS

| | | |
|---|---|---|
| 4,985,114 A | 1/1991 | Okudaira et al. ............ 156/643 |
| 5,318,667 A | 6/1994 | Kumihashi et al. .......... 156/643 |
| 5,501,893 A | 3/1996 | Laermer et al. ............. 428/161 |
| 5,719,071 A | 2/1998 | Miller et al. ................. 437/192 |
| 5,747,839 A | 5/1998 | Hammond et al. .......... 257/253 |
| 5,751,315 A | 5/1998 | Burke et al. .................... 347/63 |
| 6,071,821 A | 6/2000 | Hirata et al. ................. 438/706 |
| 6,093,330 A | 7/2000 | Chong et al. ................... 216/2 |
| 6,171,510 B1 | 1/2001 | Lee ............................... 216/27 |
| 6,187,685 B1 | 2/2001 | Hopkins et al. ............. 438/710 |

*Primary Examiner*—Allan Olsen
(74) *Attorney, Agent, or Firm*—Weingarten, Schurgin, Gagnebin & Lebovici LLP

(57) ABSTRACT

A method of etching a trench in a substrate using a dry plasma etch technique that allows precise control of lateral undercut. The method includes optionally forming at least one on-chip device or micro-machined structure in a surface of a silicon substrate, and covering the surface with a masking layer. A trench pattern is then imaged in or transferred to the masking layer for subsequent etching of the substrate. Upper portions of the trench are anisotropically etched in the substrate. The trench is then semi-anisotropically etched and isotropically etched in the substrate. By modifying isotropic etching time, a controlled lateral undercut can be achieved as the trench is etched vertically in the substrate.

36 Claims, 4 Drawing Sheets

METHOD OF ETCHING A DEEP TRENCH IN A SUBSTRATE AND METHOD OF FABRICATING ON-CHIP DEVICES AND MICRO-MACHINED STRUCTURES USING THE SAME

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to etching trenches in substrates, and more specifically to a method of etching deep trenches in substrates that allows precise control of lateral undercut. The present invention also relates to a method of fabricating on-chip devices and micro-machined structures using the deep trench etching method.

Trenches are frequently etched in substrates to form micro-electromechanical devices, to form micro-machined structures such as cantilevers or optical mirrors, and to reduce electromagnetic coupling and parasitic capacitance between on-chip devices and the substrate. Such applications in which either an on-chip device or micro-machined structure is suspended over a trench etched in a substrate present unique challenges for semiconductor manufacturers. This is because trench etching equipment has traditionally been used for either highly anisotropic etching or highly isotropic etching of substrates. In general, such highly anisotropic or isotropic etching cannot provide precise, controlled removal of substrate material located underneath on-chip devices and micro-machined structures.

One approach to fabricating on-chip devices is described in a publication entitled *A Universal MEMS Fabrication Process for High-Performance On-Chip RF Passive Components and Circuits*, Jiang et al., Solid-State Sensor and Actuator Workshop, June 2000. According to that fabrication process, silicon nitride is deposited and patterned on the substrate surface as an isolation layer, a trench is etched in the substrate by deep reactive ion etching, and a sacrificial silicon-oxide block is formed in the trench and on the isolation layer. Next, an on-chip device suspended over the trench is built by polysilicon surface micro-machining and released in hydrofluoric acid, and copper plating is performed. However, one drawback of the process of Jiang et al. is that it includes many complicated steps that can significantly increase costs of manufacture.

One approach to fabricating a micro-machined structure such as a cantilever is described in U.S. Pat. No. 6,086,774 issued to Ho et al. According to that fabrication process, a cantilever is formed by performing two (2) etching steps at opposing, non-normal angles to the substrate surface. The respective etching angles and depths are chosen such that the etched region completely undercuts and releases a portion of the substrate. Unetched substrate material under the released structure is then removed by exposing the reverse side of the substrate to a backside etch. However, the process steps described by Ho et al. are also complicated and can lead to higher manufacturing costs. Further, the process of Ho et al. can become increasingly difficult to use as die sizes are reduced and/or wafer sizes are increased. For example, as the thickness of a wafer increases, it generally becomes more difficult to perform a backside etch of the substrate.

Still another fabrication process is described in U.S. Pat. No. 4,600,934 issued to Aine et al. According to that fabrication process, an etch resistant layer is deposited on the substrate surface, angled notches are formed in the etch resistant layer, and anisotropic undercut etching is performed in the region of the notches. The rate of undercut etching is determined by the angle of the notches relative to the crystal planes of the substrate. However, the process steps described by Aine et al. are also complicated and can lead to increased manufacturing costs.

It would therefore be desirable to have a method of etching a trench in a substrate that can be employed to remove substrate material located underneath on-chip devices and micro-machined structures. Such a method would allow precise control of lateral undercut, provide increased yields, and reduce manufacturing costs.

BRIEF SUMMARY OF THE INVENTION

In accordance with the present invention, a method of etching a deep trench in a substrate is provided that allows precise control of lateral undercut. The method includes the steps of optionally forming at least one on-chip device or micro-machined structure on a surface of a silicon substrate, and covering the surface with a masking layer such as photoresist, polyimide, metal, or oxide. A trench pattern is then imaged in or transferred to the masking layer such that a trench subsequently etched in the substrate according to the pattern at least partially surrounds the optionally formed on-chip device or micro-machined structure. In the event an on-chip device is formed in a device layer of the silicon substrate, the device layer is etched using a standard passivation etch technique to expose at least a portion of the bulk silicon. Upper portions of the trench are then anisotropically etched in the silicon substrate using a dry plasma etch technique. In a preferred embodiment, C4F8 and SF6 are employed as the active etching agents. Next, the trench is semi-anisotropically etched in the substrate with the C4F8 and SF6 active etching agents such that etching conditions are unchanged for the C4F8 anisotropic etching agent, but the etching conditions are modified for the SF6 isotropic etching agent. In a preferred embodiment, the etching conditions of the SF6 isotropic etching agent are modified to increase the pulse duration. The trench is then isotropically etched in the substrate with the SF6 isotropic etching agent. In a preferred embodiment, the bias power is reduced to a minimum during the isotropic etch. Finally, the remaining masking layer is stripped away. By modifying isotropic etching time, a precise, controlled lateral undercut can be achieved as the trench is etched vertically in the silicon substrate. Such a precise, controlled lateral undercut can be used to remove substrate material located underneath the on-chip device or micro-machined structure.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

A method of etching a laterally defined recess structure such as a trench or cavity in a substrate is disclosed. The presently disclosed etching method allows precise control of lateral undercut, and can be employed to remove substrate material located underneath on-chip or micro-machined devices formed on the substrate. The disclosed etching method is carried out using high density dry plasma etching equipment such as the ALCATEL 601e etching system or any other suitable dry plasma etching equipment. Because the disclosed etching method employs a high density dry plasma etching technique, high etch consistency and high etch yield is achieved. Further, because the dry plasma etching technique is employed to etch a deep trench from the front side of the substrate, the need to perform a backside etch of the substrate is eliminated. This makes the disclosed etching method highly scalable. In bulk silicon, the disclosed etching method has an etch rate of at least 7 $\mu$m/min, and can etch a deep trench in the silicon substrate down to a desired maximum depth with a precise, controlled lateral undercut. In a preferred embodiment, the chemicals employed with the disclosed method include C4F8 and SF6.

Figure 1A:
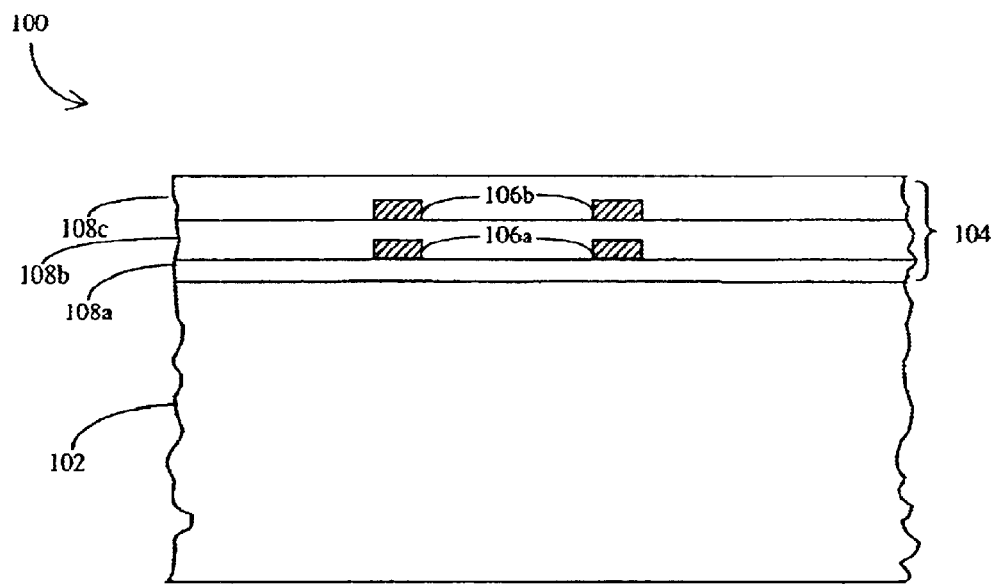
FIGS. 1a–1b depict sequential steps in fabricating an on-chip passive device such as an inductor.
Figure 1B:
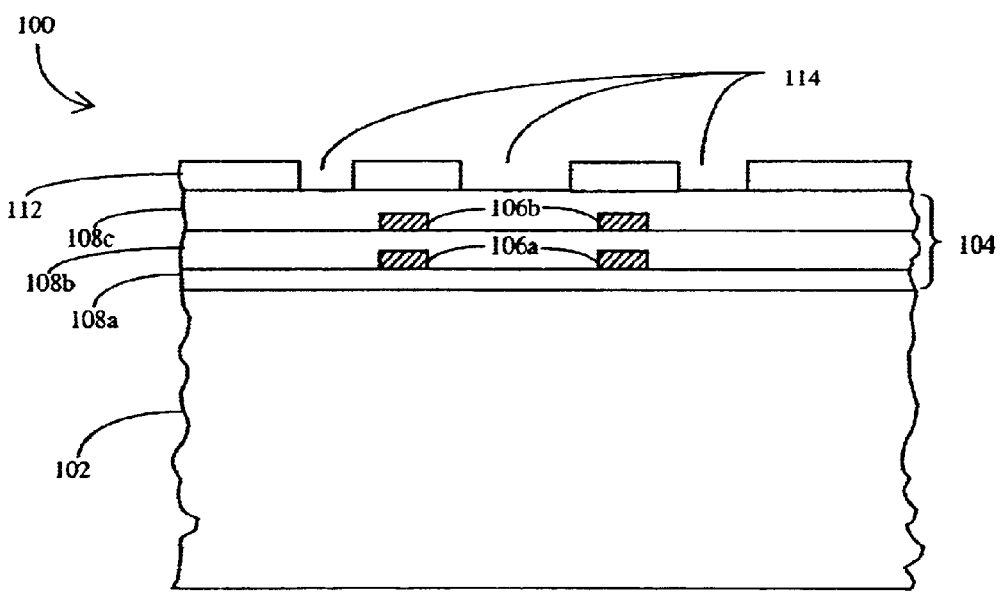

FIGS. 1a–1b depict sequential steps in fabricating an exemplary on-chip device. The presently disclosed deep trench etching method may be employed to etch a trench underneath the on-chip device, e.g., to reduce electromagnetic coupling and parasitic capacitance between the on-chip device and the substrate. It is understood that the disclosed etching method may be employed to etch trenches in substrates for other purposes, e.g., to provide isolation between adjacent on-chip devices, to contact a buried layer in the substrate, to form a micro-electromechanical device, and to release a micro-machined device such as a cantilever or an optical mirror. The disclosed method is described herein in relation to the fabrication of exemplary on-chip devices for clarity of discussion.

FIG. 1a shows a cross-sectional view of a portion 100 of a semiconductor wafer including a silicon substrate 102 and a device layer 104. For example, an on-chip device such as an inductor, a capacitor, a transformer, a transistor, a micro-antenna or any other device that can be formed on a silicon substrate may be fabricated in the device layer 104. It is understood that a standard Complementary Metal Oxide Semiconductor (CMOS) process or any other suitable semiconductor process, and any suitable masking and plating technique may be used in fabricating the on-chip device.

In the illustrated embodiment, two (2) exemplary on-chip inductor devices are fabricated in the device layer 104 using a standard double-poly double-metal CMOS process. The exemplary inductor devices comprise respective first metal layer coil portions 106a and respective second metal layer coil portions 106b. It is noted that the two (2) metal layers used to form the respective inductor coils provide low impedance and therefore reduce substrate losses. Specifically, a first patterned dielectric layer 108a is formed above the silicon substrate 102, and the first patterned metal layer 106a is disposed on top of the first dielectric layer 108a. Next, a second patterned dielectric layer 108b is formed above the first metal layer 106a, and the second patterned metal layer 106b is disposed on top of the second dielectric layer 108b and over at least part of the first metal layer 106a. The second dielectric layer 108b includes a plurality of vias (not shown) penetrating through the second dielectric layer 108b to allow electrical connection between the respective first and second metal layer coil portions 106a and 106b of the two (2) inductors. A third patterned dielectric layer 108c is then formed above the second metal layer 106b.

Next, the surface of the device layer 104 is coated with a masking layer 112 (see FIG. 1b) comprising, e.g., photoresist, polyimide, metal, and/or oxide. In a preferred embodiment, the masking layer 112 comprises a photoresist layer that is from 6 to 10 $\mu$m thick and has an etching rate selectivity of photoresist to silicon equal to approximately 150:1. A trench pattern is then imaged in the photoresist layer 112 such that a trench subsequently etched in the substrate according to the pattern at least partially surrounds the two (2) inductors. For example, the trench pattern may define a plurality of openings 114 in the photoresist layer 112. It is noted that any suitable number of openings 114 may be defined in the photoresist layer 112 to form the trench pattern.

FIGS. 2a–2d depict sequential steps in etching a deep trench in a substrate in accordance with the present invention. For example, a deep trench may be etched underneath the two (2) on-chip inductor devices of FIGS. 1a and 1b to suspend the on-chip devices over the trench and reduce electromagnetic coupling and parasitic capacitance between the on-chip devices and the silicon substrate 102. First, the device layer 104 is etched using a standard passivation etch technique to form a plurality of cavities 216 (see FIG. 2a) that extend through the device layer 104, thereby exposing at least a portion of the bulk silicon substrate 102. In a preferred embodiment, the passivation etch is sufficient to allow the respective cavities 216 to extend completely through the device layer 104 and partially into the silicon substrate 102. It is understood that the respective cavities 216 formed by the standard passivation etch technique comprise straight, vertical cavities with virtually no undercut.

Next, an anisotropic etch is performed on the exposed portions of the bulk silicon substrate 102 using a combination of the C4F8 and SF6 gases in a dry plasma etch technique. The anisotropic etch forms upper portions 220a (see FIG. 2b) of a trench 220 (see FIGS. 2c and 2d) in the silicon substrate 102. In a preferred embodiment, the C4F8 and SF6 gases are alternately pulsed. The C4F8 gas preferably flows at a rate of 120 sccm with a pulse duration of 3 seconds, a source power of 2000 W, a bias power of 200 V, and a processing pressure of 3.5 Pa; and, the SF6 gas preferably flows at a rate of 240 sccm with a pulse duration of 10 seconds, a source power of 1600 W, a bias power of 200 V, and a processing pressure of 7.5 Pa. Because the anisotropic etch is a timed etch, the depth of the anisotropic etch is proportional to the period of the anisotropic etch. In one embodiment, the anisotropic etch period is equal to 3 minutes. It is noted that the above-described anisotropic etch technique minimally undercuts the device layer 104.

A semi-anisotropic etch is then performed using the C4F8 anisotropic etching agent and the SF6 isotropic etching agent in the dry plasma etch technique. The semi-anisotropic etch forms the trench 220 (see FIG. 2c) in the silicon substrate 102. Again, in the preferred embodiment, the C4F8 and SF6 gases are alternately pulsed. The C4F8 gas preferably flows at a rate of 120 sccm with a pulse duration of 3 seconds, a source power of 2000 W, a bias power of 200 V, and a processing pressure of 3.5 Pa; and, the SF6 gas preferably flows at a rate of 240 sccm with a pulse duration of 30 seconds, a source power of 1600 W, a bias power of 150 V, and a processing pressure of 7.5 Pa. Because the pulse duration is increased and the bias level is reduced for the SF6 isotropic etching agent, the affect of the SF6 isotropic etching agent is enhanced compared to the initial anisotropic etch. As a result, as the C4F8 and SF6 gases are alternately pulsed, the C4F8 gas is primarily employed for anisotropically etching the trench 220 vertically in the silicon substrate 102, and the SF6 gas is primarily employed for isotropically etching the trench 220 vertically and laterally in the silicon substrate 102. The shape of the trench 220 can be precisely controlled, e.g., by adjusting the flow rate, pulse duration, and/or the bias power for the SF6 isotropic etching agent. Because the semi-anisotropic etch is a timed etch, a predetermined depth 222 (see FIG. 2c) of the trench 220 is proportional to the period of the semi-anisotropic etch. In the illustrated embodiment, the semi-anisotropic etch period is sufficient to allow the predetermined depth 222 of the trench 220 to be approximately equal to 300 µm, and the lateral undercut to be approximately zero. In one embodiment, the semi-anisotropic etch period is equal to 15 minutes. It is noted that the semi-anisotropic etch forms re-entrant shapes in respective sidewalls 224 (see FIG. 2c) of the trench 220. Further, at least one wall 226 (see FIG. 2c) of substrate material may remain directly underneath the on-chip devices at the completion of the semi-anisotropic etch.

Next, an isotropic etch is performed using the SF6 gas and the dry plasma etch technique. In a preferred embodiment, the SF6 gas flows at a rate of 500 sccm with a source power of 2000 W, a bias power of 60 V, and a processing pressure of 22 Pa. The preferred isotropic etch conditions are sufficient to remove the walls 226 (see FIG. 2c) of substrate material directly below the two (2) on-chip inductor devices. As shown in FIG. 2d, after the final isotropic etch, the trench 220 extends laterally in the silicon substrate 102 with very small spikes of substrate material underneath the respective devices. It is noted that the isotropic etch is a timed etch. In a preferred embodiment, the isotropic etch period is sufficient to allow the complete removal of the walls 226 of substrate material from the trench 220, and to allow a predetermined depth 228 of the trench 220 to be approximately equal to 400 µm. In one embodiment, the isotropic etch period is equal to 15 minutes. It is further noted that the isotropic etch causes a relatively small amount of undercut in the respective sidewalls 224 of the trench 220. Finally, the remaining photoresist layer 112 is stripped from the surface of the device layer 104 using any suitable technique.

Figure 3:
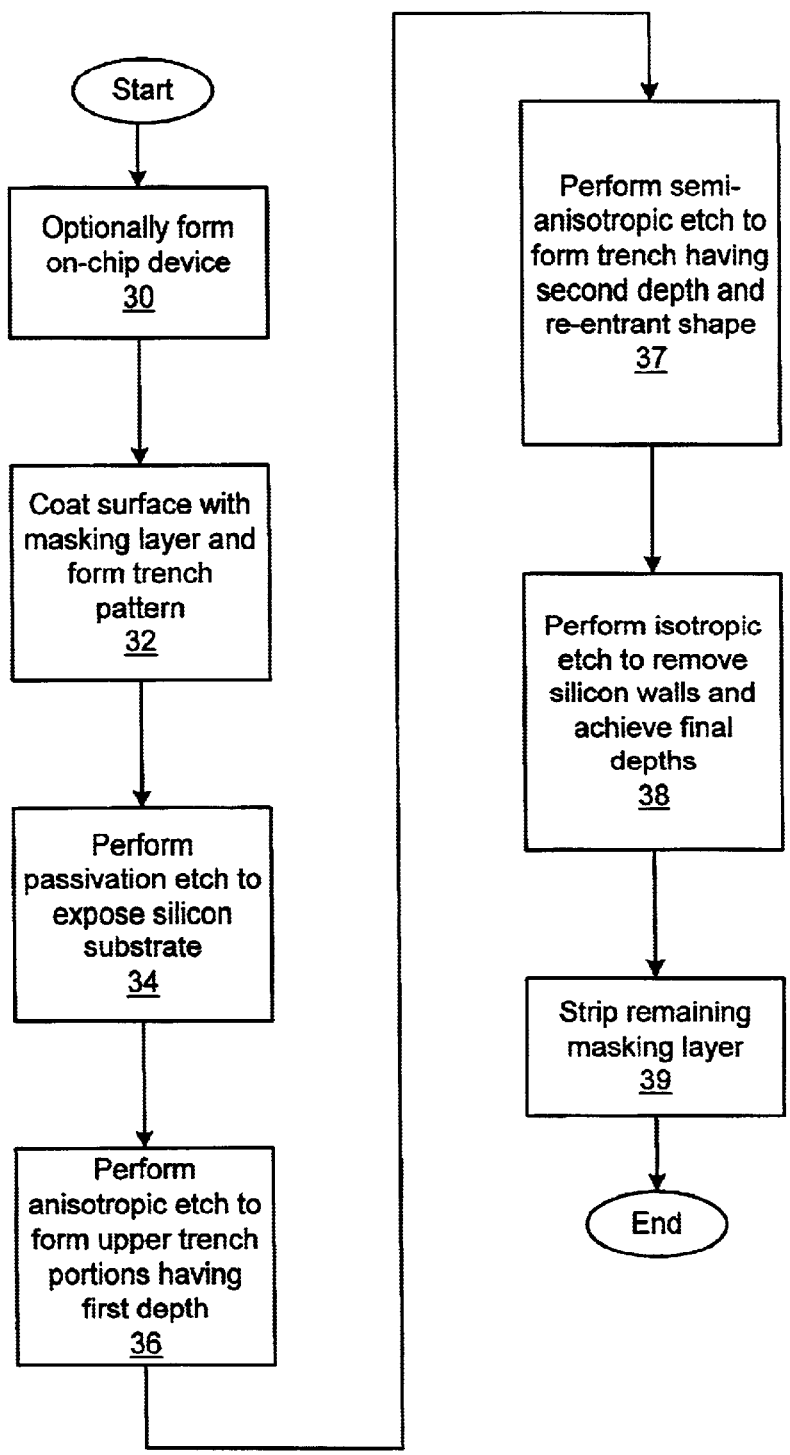
FIG. 3 is a flow diagram depicting an exemplary method of etching a trench in a substrate in accordance with the present invention.

The presently disclosed method of dry plasma etching a trench in a substrate is illustrated by reference to FIG. 3. As depicted in step 30, at least one on-chip device is optionally formed in a device layer of a silicon substrate using any suitable silicon process. Next, the surface of the device layer is coated, as depicted in step 32, with a suitable masking layer, and a trench pattern is imaged in or transferred to the masking layer. The device layer is then etched, as depicted in step 34, using a standard passivation etch technique to expose at least a portion of the bulk silicon substrate. Next, an anisotropic etch is performed, as depicted in step 36, to form upper portions of a trench having a first predetermined depth in the substrate; and, a semi-anisotropic etch is performed, as depicted in step 37, to form the trench to a second predetermined depth with approximately zero lateral undercut. It is noted that a re-entrant shape is formed in the trench. An isotropic etch is then performed, as depicted in step 38, to remove any walls of substrate material that may remain directly underneath the on-chip device and achieve a final predetermined depth of the trench. Next, any remaining masking layer is stripped, as depicted in step 39, from the surface of the device layer.

Figure 2A:
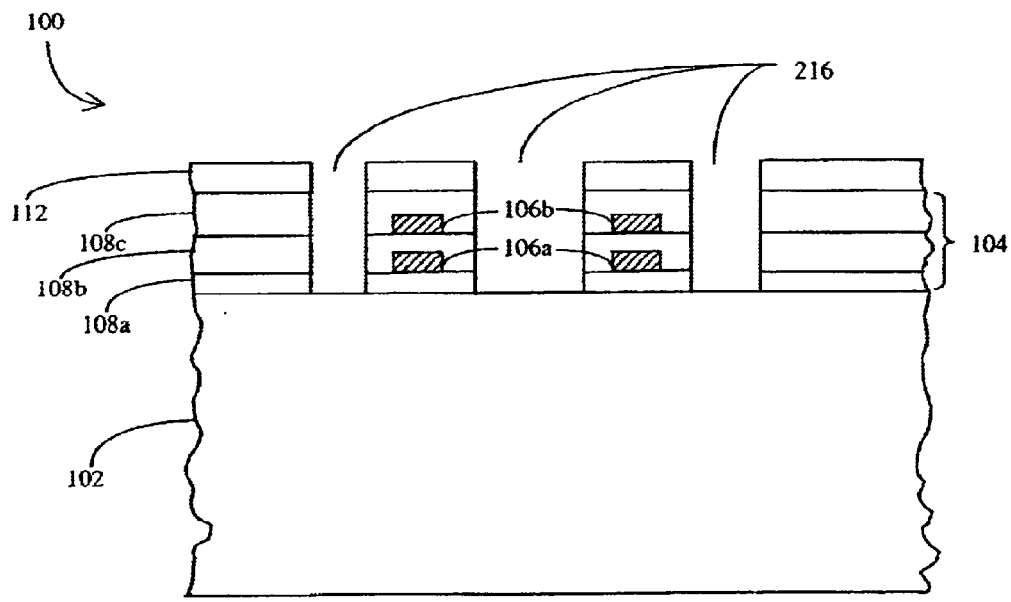
FIGS. 2a–2d depict sequential steps in etching a trench in a substrate in accordance with the present invention.
Figure 2B:
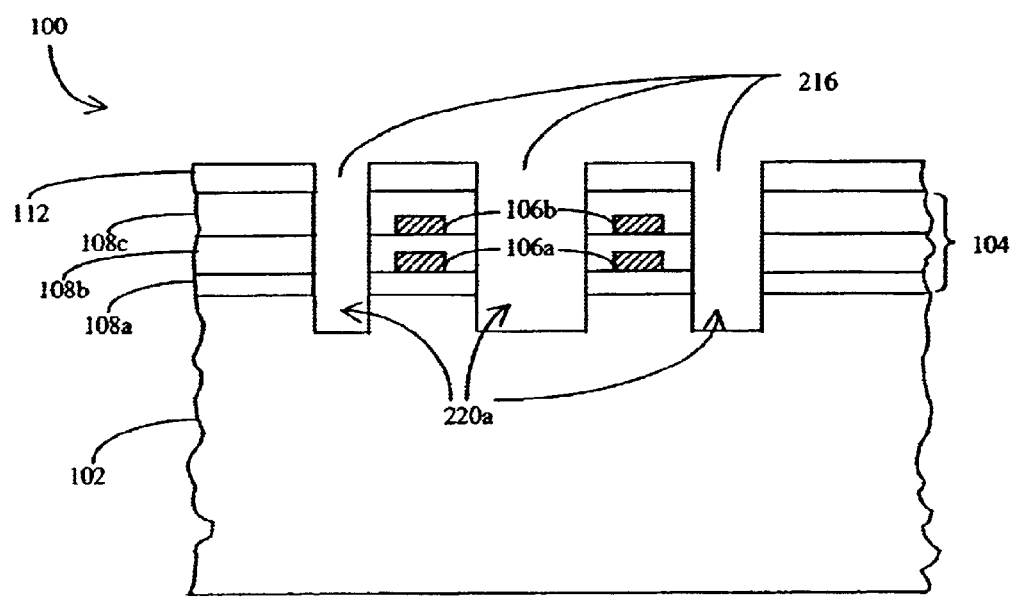
Figure 2C:
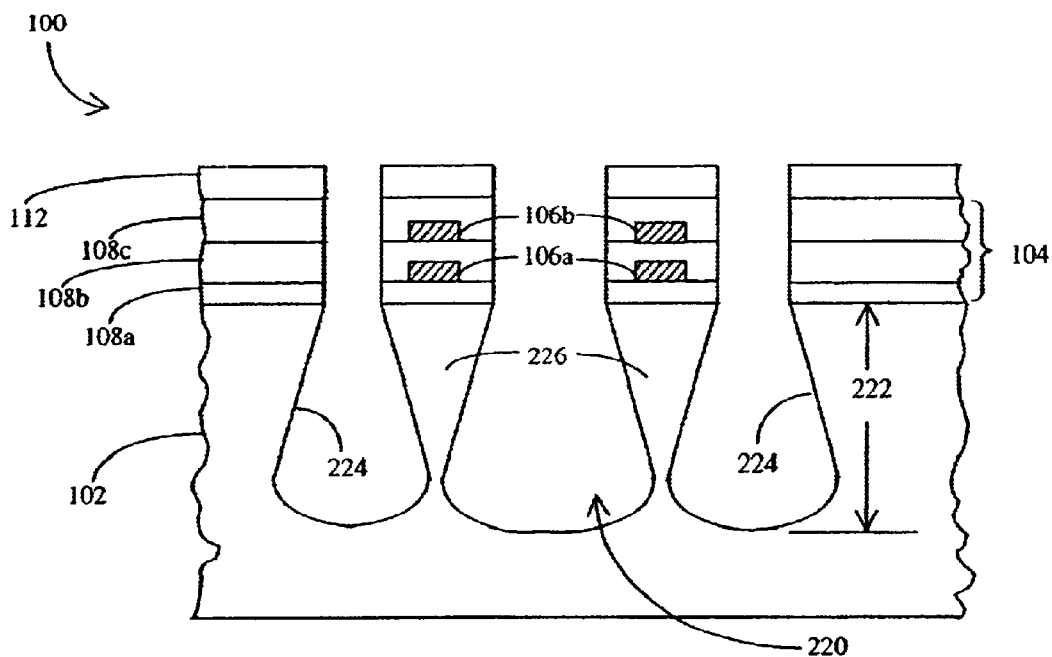
Figure 2D:
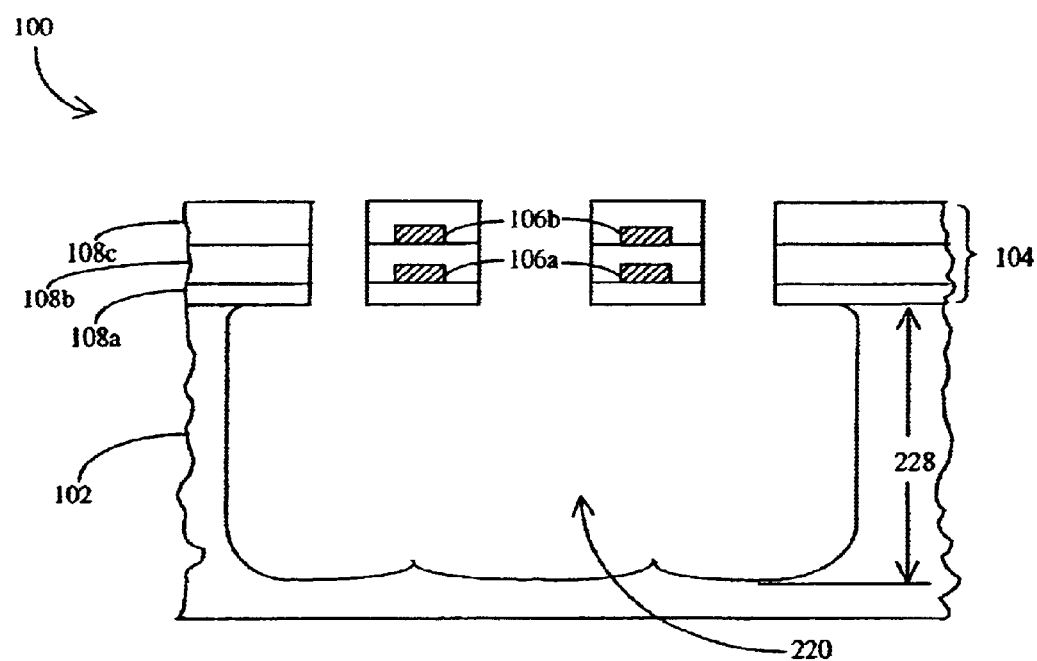

As described above, the isotropic etch causes a relatively small amount of undercut to occur in the regions of the trench sidewalls 224 (see FIG. 2c). Such undercut may be further controlled by covering the sidewalls 224 and bottom surface (not numbered) of the trench 220 with a suitable polymer at least once before or during the performance of the anisotropic etch and/or the semi-anisotropic etch. Those of ordinary skill in this art should appreciate that such polymers act as an etching stop on surfaces of silicon substrates.

It is noted that other known etching agents may be used in carrying out the presently disclosed etching method instead of the C4F8 and SF6 gases. It is understood, however, that in order to derive the benefits of the disclosed method, the alternative etching agents should be used in conjunction with suitable etching conditions to produce at least an anisotropic etch followed by a semi-anisotropic etch to achieve deep trench etching with precise control of lateral undercut.

It will be further appreciated by those of ordinary skill in this art that modifications to and variations of the above-described methods may be made without departing from the inventive concepts disclosed herein. Accordingly, the invention should not be viewed as limited except as by the scope and spirit of the appended claims.

What is claimed is:

1. A method of dry plasma etching a substrate to form at least one laterally-defined recess structure in the substrate, comprising the steps of:
    performing a first etching under a first etching condition, the first etching including anisotropically etching the substrate to a first etch depth; and
    performing a second etching under a second etching condition, the second etching including semi-anisotropically etching the substrate to a second etch depth, thereby forming the laterally defined recess structure with precise control of lateral undercut.

2. The method of claim 1 wherein the first etching condition comprises a first isotropic etch duration and the second etching condition comprises a second isotropic etch duration, and the method further comprises controlling the lateral undercut by adjusting at least one of the first and second isotropic etch durations during at least one of the first and second performing steps.

3. The method of claim 1 wherein the first etching condition comprises a first isotropic etch duration and the second etching condition comprises a second isotropic etch duration, and the second performing step includes controlling the lateral undercut by adjusting the second isotropic etch duration.

4. The method of claim 3 wherein the controlling step includes adjusting the second isotropic etch duration to be greater than the first isotropic etch duration.

5. The method of claim 1 wherein the second etching condition comprises a plurality of factors including a gas flow rate, a gas pulse duration, and a bias power, and the second performing step includes controlling the lateral undercut by adjusting at least one of the plurality of factors of the second etching condition.

6. The method of claim 1 further comprising the step of performing a third etching under a third etching condition, the third etching including isotropically etching the substrate to a third etch depth.

7. The method of claim 6 wherein the third etching condition comprises a minimal bias power.

8. The method of claim 6 wherein the third performing step includes isotropically etching the substrate to form at least one undercut section in the substrate.

9. The method of claim 8 wherein the undercut section of the substrate formed during the third performing step comprises at least one micro-machined device.

10. The method of claim 9 wherein the micro-machined device is selected from a cantilever and an optical mirror.

11. The method of claim 8 wherein the undercut section of the substrate formed during the third performing step comprises at least one on-chip device.

12. The method of claim 11 wherein the on-chip device is selected from an inductor, a capacitor, a transformer, a transistor, and a micro-antenna.

13. The method of claim 1 wherein the first etching condition is the same as the second etching condition with respect to types of gases employed for the etching.

14. The method of claim 13 wherein the types of gases employed include C4F8 and SF6.

15. The method of claim 1 wherein the first etching condition differs from the second etching condition with respect to at least one factor selected from a gas flow rate, a gas pulse duration, a total etch duration, a source power, and a bias power.

16. The method of claim 15 wherein the first etching condition comprises a SF6 gas pulse duration of approximately 10 seconds, and the second etching condition comprises an SF6 gas pulse duration of approximately 30 seconds.

17. The method of claim 15 wherein the first etching condition comprises a total etch duration of approximately 3 minutes, and the second etching condition comprises a total etch duration of approximately 15 minutes.

18. The method of claim 15 wherein the first etching condition comprises a bias power of approximately 200 volts during an SF6 gas pulse duration, and the second etching condition comprises a bias power of approximately 150 volts during an SF6 pulse duration.

19. The method of claim 1 wherein the first performing step includes anisotropically etching the substrate through a patterned masking layer, and the second performing step includes semi-anisotropically etching the substrate through the patterned masking layer.

20. The method of claim 19 wherein the patterned masking layer employed in the first and second performing steps comprises one or more layers selected from photoresist, polyimide, metal, and oxide.

21. A method of fabricating a device suspended on a substrate, comprising the steps of:
   forming the device on the substrate; and
   forming a cavity underneath the device to suspend the device on the substrate,
   wherein the second forming step comprises
      performing a first etching under a first etching condition, the first etching including anisotropically etching the substrate through a patterned masking layer to a first etch depth; and
      performing a second etching under a second etching condition, the second etching including semi-anisotropically etching the substrate through the patterned masking layer to a second etch depth, thereby forming the cavity underneath at least a portion of the device with precise control of lateral undercut.

22. The method of claim 21 wherein the first etching condition comprises a first isotropic etch duration and the second etching condition comprises a second isotropic etch duration, and the method further comprises controlling the lateral undercut by adjusting at least one of the first and second isotropic etch durations during at least one of the first and second performing steps.

23. The method of claim 21 wherein the first etching condition comprises a first isotropic etch duration and the second etching condition comprises a second isotropic etch duration, and the second performing step includes controlling the lateral undercut by adjusting the second isotropic etch duration.

24. The method of claim 23 wherein the controlling step includes adjusting the second isotropic etch duration to be greater than the first isotropic etch duration.

25. The method of claim 21 wherein the second etching condition comprises a plurality of factors including a gas flow rate, a gas pulse duration, and a bias power, and the second performing step includes controlling the lateral undercut by adjusting at least one of the plurality of factors of the second etching condition.

26. The method of claim 21 further comprising the step of performing a third etching under a third etching condition, the third etching including isotropically etching the substrate through the patterned masking layer to a third etch depth to form the cavity by laterally undercutting the device.

27. The method of claim 26 wherein the device laterally undercut during the third performing step comprises at least one micro-machined device.

28. The method of claim 27 wherein the micro-machined device is selected from a cantilever and an optical mirror.

29. The method of claim 26 wherein the device laterally undercut during the third performing step comprises at least one on-chip device.

30. The method of claim 29 wherein the on-chip device is selected from an inductor, a capacitor, a transformer, a transistor, and a micro-antenna.

31. The method of claim 21 wherein the patterned masking layer employed in the first and second performing steps comprises one or more layers selected from photoresist, polyimide, metal, and oxide.

32. A method of dry plasma etching a substrate to form at least one trench in the substrate, comprising the steps of:
   performing a first etching using an anisotropic etching agent and an isotropic etching agent to etch the substrate to a first etch depth, the first etching including alternately pulsing the anisotropic etching agent and the isotropic etching agent at respective first pulse durations; and
   performing a second etching using the anisotropic etching agent and the isotropic etching agent to etch the substrate to a second etch depth and form a re-entrant shape in the trench with approximately zero lateral undercut, the second etching including alternately pulsing the anisotropic etching agent and the isotropic etching agent at respective second pulse durations,
   wherein the second pulse duration of the isotropic etching agent is greater than the first pulse duration of the isotropic etching agent.

33. The method of claim 32 wherein the first and second pulse durations of the anisotropic etching agent are the same.

34. The method of claim 32 wherein the anisotropic etching agent comprises C4F8 gas and the isotropic etching agent comprises SF6 gas.

35. The method of claim 34 wherein the first and second pulse durations of the C4F8 gas are approximately equal to 3 seconds.

36. The method of claim 34 wherein the first pulse duration of the SF6 gas is approximately equal to 10 seconds, and the second pulse duration of the SF6 gas is approximately equal to 30 seconds.

* * * * *